United States Patent [19]

Kubotera et al.

[11] 4,115,118

[45] Sep. 19, 1978

[54] PROCESS FOR PRODUCTION OF PRINTING PLATE

[75] Inventors: Kikuo Kubotera; Akira Kashiwabara; Kotaro Sato, all of Osaka, Japan

[73] Assignee: Fuji Photo Film Co., Ltd., Ashigara, Japan

[21] Appl. No.: 750,495

[22] Filed: Dec. 14, 1976

Related U.S. Application Data

[63] Continuation of Ser. No. 546,173, Jan. 31, 1975, abandoned.

[30] Foreign Application Priority Data

Jan. 31, 1974 [JP] Japan .................................. 49-13211

[51] Int. Cl.$^2$ ............................................. G03F 7/02
[52] U.S. Cl. ........................................ 96/33; 96/36.3; 96/59; 101/456; 101/457; 101/467
[58] Field of Search ................... 96/36.3, 33, 59, 111; 101/456, 457, 467

[56] References Cited

U.S. PATENT DOCUMENTS

| | | | |
|---|---|---|---|
| T825,262 | 11/1969 | Yackel | 96/33 |
| T867,012 | 10/1969 | Woodward et al. | 96/36.3 |
| 3,600,166 | 8/1971 | Sieg et al. | 96/36.3 |
| 3,615,444 | 10/1971 | Ohkubo et al. | 96/33 |
| 3,615,517 | 10/1971 | Milton et al. | 96/33 |
| 3,669,018 | 6/1972 | Wheelock | 96/33 |
| 3,745,013 | 7/1973 | Ohi et al. | 96/111 |

*Primary Examiner*—Edward C. Kimlin
*Attorney, Agent, or Firm*—Sughrue, Rothwell, Mion, Zinn and Macpeak

[57] ABSTRACT

A process for producing a printing plate comprising imagewise exposing a light-sensitive material comprising a support with a hydrophilic surface and having thereon an unhardened silver halide emulsion layer, developing the imagewise exposed light-sensitive material with a non-tanning developer, fogging the remaining silver halide, developing the fogged remaining silver halide with a tanning developer to thereby simultaneously harden the emulsion layer at the areas developed, and removing the unhardened emulsion layer, whereby an oleophilic tanning relief image is formed.

7 Claims, 2 Drawing Figures

PROCESS FOR PRODUCTION OF PRINTING PLATE

This is a continuation of application Ser. No. 546,173, filed Jan. 31, 1975, now abandoned.

BACKGROUND OF THE INVENTION

1. Field of the Invention

The present invention relates to a process for the production of a printing plate. More particularly, the present invention relates to a process for the production of a printing plate which can provide a positive print using a positive original, or a positive print using a negative original.

2. Description of the Prior Art

In general, a planographic printing plate comprises an oleophilic ink receptive area where an image area is formed, and a hydrophilic area where a non-image area is formed. In producing such a printing plate, a method comprising rendering a hydrophilic surface oleophilic only at the image areas, a method comprising providing a hydrophilic layer on the surface of an oleophilic material and removing the hydrophilic layer only at the image areas, thereby exposing the oleophic surface, or a like method is known. Hitherto, the so-called positive working light-sensitive printing plate in which a positive duplicate is produced from a positive original without producing an intermediate negative, has been proposed in, for example, U.S. patent application, Ser. No. 397,986, filed Sept. 21, 1964 (corresponding to British Pat. Nos. 1,129,366 and 1,133,856). The method for the production of a printing plate as described in U.S. patent application Ser. No. 397,986 comprises providing a hydrophilic layer containing a nucleus material for the diffusion transfer process on a support having an oleophilic surface, placing a light-sensitive plate coated with a silver halide light-sensitive emulsion on the hydrophilic layer, forming a silver image on the hydrophilic layer by diffusion transfer development, and removing the hydrophilic layer at the corresponding areas by etch-bleach processing utilizing the silver image, thereby exposing the oleophilic support. In accordance with the method as described in U.S. patent application Ser. No. 650,701, filed July 3, 1961 (corresponding to British Pat. No. 1,235,911), a light-sensitive plate produced by coating a direct positive type gelatin-silver halide emulsion having a melting point of about 82° C. on a support having an ink receptive oleophilic surface, for example, polyethylene, is exposed, a silver positive image is formed by development, the emulsion layer at the silver image areas is removed by applying an etch-bleach processing to thereby expose the ink-receptive oleophilic surface, and thus a printing plate is produced. In the method of U.S. Pat. No. 3,326,685, a light-sensitive plate produced by coating a layer containing a tanning developer on a support, coating a silver halide emulsion layer on the layer, and furthermore, coating a fogged silver halide emulsion layer on the silver halide emulsion layer, is used, and development is conducted by treatment with an alkaline solution after exposure. In this case, the light-sensitized emulsion layer is tanning-developed, thereby forming a negative image. On the other hand, at the non-image areas in the unsensitized areas, the upper-most and fogged silver halide emulsion layer is tanning-developed and gelatin at the areas is hardened depending upon the exposure amount, thereby forming an oleophilic image area.

However, printing plates produced by these methods have the following defects. First of all, these printing plates are all produced for the purpose of reproducing a line drawing original, and thus they are disadvantageous in that reproduction of gradation is bad. In general, in the case of a photographic printing plate, it is necessary to change an original having a continuous gradation into a half-tone gradation. In accordance with presently used standard methods, an original having a continuous tone is printed out on a high-contrast lith-type light-sensitive material by covering the original with a screen, lith-type development accompanied with infectuous development is conducted to thereby produce a half-tone negative or half-tone positive comprising a half-tone image of hard dots, the resulting negative or positive is printed out on a suitable printing plate, for example, a pre-sensitized plate, and development processing is conducted, thereby forming a printing plate.

However, in the case of resolving directly into half-tone gradation by covering an original with a screen, where generally used developers are employed, only silver half-tone dot images having soft dots are obtained. As can be predicted from the principle of projection, the light pattern of the screen mesh is cone-shaped, and at the center, light is the strongest, and at the periphery, light is the weakest, and the light strength varies continuously between them. A photographic light-sensitive material has the ability to show an intermediate density in addition to a maximum density and a minimum density (fog) required for forming a half-tone dot and thus, as can be naturally predicted, a silver image is formed according to the light pattern. Thus, since the density is decreased as the half-tone dot advances from the center to the periphery, density gradient areas naturally occur which is not advantageous in plate making. As a result, only a half-tone dot image of soft dots is obtained. Therefore, with the above described light-sensitive materials and using the above described method, it is impossible to produce a photographic half-tone dot plate. A printing plate produced by direct-screening from an original having a continuous gradation has extremely poor tone-reproduction and furthermore extremely poor printing stability. Thus, with these known methods, it has not been possible to obtain a duplicate having good continuous gradation. In accordance with the method as disclosed in U.S. Pat. No. 3,650,742, a light-sensitive plate produced by coating a silver halide emulsion on an aluminum sheet having an anodic oxidation film on the surface thereof is exposed, a silver negative image is formed by conducting lith-development, the silver image areas are etched by applying etch-bleach processing to thereby uncover the hydrophilic anodic oxidation film, and furthermore, the emulsion layer at the non-image areas is hardened by heating the plate to thereby form an ink-receptive oleophilic gelatin image. As a result, a printing plate is produced in which the image areas are hydrophilic and the non-image areas are oleophilic. Since conventional lith-type light-sensitive materials and lith-type processing are employed in the present invention, a silver half-tone image obtained by direct screening has extremely hard dots free from fringe. However, this method has a second defect in the subsequent etch-bleach processing. That is, the half-tone dot area is increased by the etch-bleach processing, thereby causing discontinuous increases of the density, and furthermore, the non-image area is also side-etched at the shadow area and the halftone dot is made larger, and thus the tone reproduction is extremely bad.

As is apparent from the above explanation, a printing plate produced by direct screening from an original having a continuous gradation in accordance with known methods has extremely poor tone reproduction. As a matter of fact, it has been impossible to produce a duplicate having a good continuous gradation by known methods.

SUMMARY OF THE INVENTION

An object of the present invention is to provide a process for the production of a printing plate which is excellent in continuous gradation reproduction.

Another object of the present invention is to provide a process for producing simply and easily a printing plate from an original having a continuous gradation by applying a direct screening to a light-sensitive printing plate material.

A further object of the present invention is to provide a photographic image reversal method in producing a photographic printing plate.

These and other objects of the present invention will becomes apparent from the following explanation.

The present invention provides a process for producing a printing plate comprising imagewise exposing a light-sensitive plate comprising a support with a hydrophilic surface and having thereon an unhardened silver halide emulsion layer, subjecting the light-sensitive plate to a first development using a non-tanning developer to thereby form a negative silver image thereon, fogging the remaining silver halide, subjecting the light-sensitive plate to a second development using a tanning developer to thereby form a positive image and to simultaneously hardened the emulsion layer at the positive silver image areas, and washing out the unhardened silver halide emulsion layer at the negative silver image areas formed by the first development to thereby leave a positive relief image.

DETAILED DESCRIPTION OF THE INVENTION

The present invention will be explained by reference to several embodiments, taken in connection with the accompanying drawings.

Figure 1:
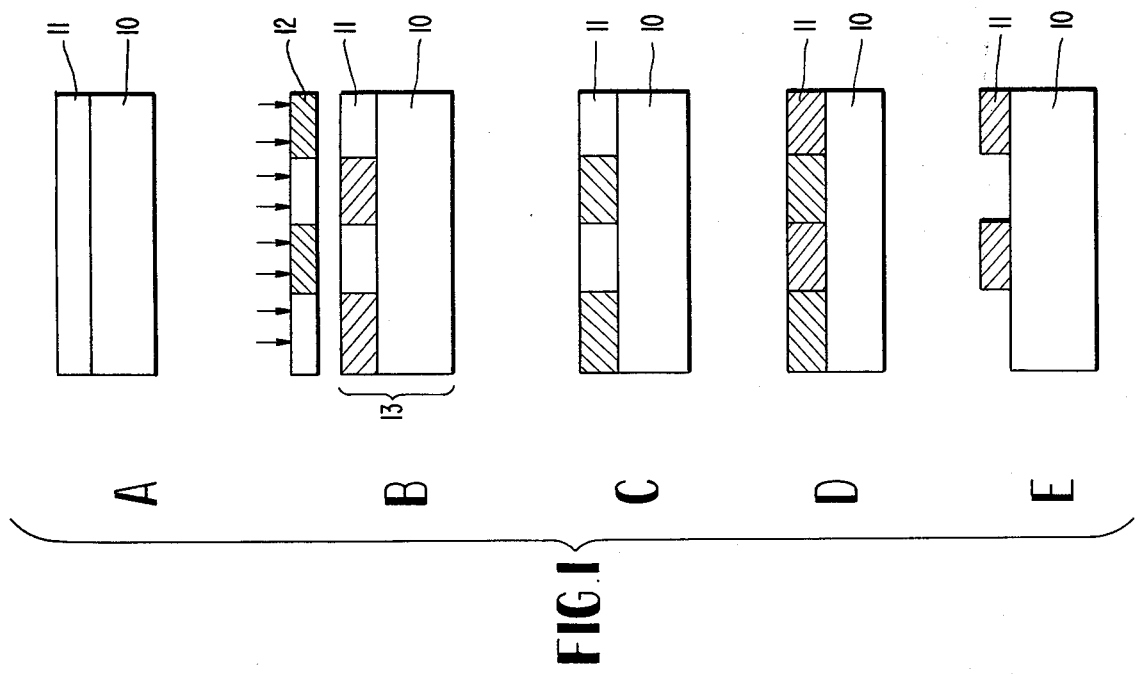

FIG. 1 is illustrative of a first embodiment of the present invention (embodiment 1). A is a sectional view of a light-sensitive material, in which an unhardened silver halide emulsion of high contrast 11 is present on an aluminum plate 10 subjected to an anodic oxidation treatment. B through E are sectional views of the light-sensitive material at the main steps in the course of producing a printing plate by embodiment 1 of the present invention. In B, exposure is applied through an original 12, and thus a latent image corresponding to the non-image areas of the original 12 is formed on the emulsion layer 11 of a printing plate 13. C shows the state in which the printing plate is developed with a common developer, and a silver image is formed at the exposed areas of the emulsion layer 11. The thus obtained image is a negative image in which light and dark areas are opposite to those of the original 12. Then, the development is stopped and a second exposure (uniform reverse exposure) is applied from the side of the surface. In the second exposure, the remaining silver halide which was not exposed in the first exposure, is exposed. Then, a tanning development is conducted. The tanning developer is, as is well known, a developer which hardens the gelatin film at the developed image areas in developing the silver halide, and thus a gelatin film in which the degree of hardening varies depending upon the quantity of exposure on the photosensitive layer is formed. Since the hardening action varies depending upon the kind of the developing agent used in the tanning development, it is necessary to use a developing agent which has a particularly high ability to harden gelatin. It has been observed that a developing agent having at least two hydroxyl groups has an excellent ability to harden gelatin in development. Developing agents are grouped as follows in the order of tanning ability.

1. Those compounds containing at least two hydroxy groups such as pyrogallol, catechol, hydroquinone, and derivatives thereof.

2. Developing agents containing one hydroxy group such as p-aminophenol, Metol, 2,4-diaminophenol, and the like.

3. Developing agents which do not contain hydroxy groups such as p-phenylene diamine.

A superadditivity occurs in the tanning development, and a combination of developers in above groups (1) and (2) produces good tanning ability.

Tanning developing agents, which can be used in combination with Metol, include pyrogallol, tannic acid, hydroquinone, catechol, gallic acid, phloroglucin, phloroglucide, ascorbic acid, resorcin, and the like. The degree of hardening of the gelatin film at tanning development is not necessarily related to the quantity of the silver reduced in the development reaction, and it varies depending upon the kind of the developer. For example, the hardening action varies depending upon the pH, humidity, sulfite content in developer, and the like. In particular, the influence of sulfite is large, and often the hardening of gelatin is not caused by a developer in which the oxidation product of the developing main agent is reduced by adding sulfite, generally in an amount of about 5 g of more per liter of the developer (non-tanning developer).

An explanation is that in tanning development (sulfite is added in an amount of 5 g or less per liter of the developer), gelatin molecules constituting the gelatin film are combined with the oxidation product of the main developing agent, thereby forming cross linkages among the gelatin molecules.

Tanning development is well-known and described in detail in P. Grafikides, *Photographic Chemistry*, Vol. 2, pp. 664–666, Fountain Press, London (1958). A tanning developer has the following composition:

(1) Main developing agent: (2) Development accelerator: (3) Inhibitor: (4) Antifogging agent., etc.

A non-tanning developer contains (5) preservatives in addition to the above components.

The developing agent (1) of a tanning developer contains an organic reducing agent as a major component and forms visible metalic silver utilizing the latent image formed in the silver halide emulsion. Benzene derivatives, naphthalene derivatives, and the like are used as the organic reducing agent. In the present invention, the combination of a 3-pyrazolidone compound or an aminophenol compound and a polyhydroxy benzene compound is particularly useful. Representative examples of developing agents are 3-pyrazolidone compounds such as 1-phenyl-3-pyrazolidone, 1-p-tolyl-3-pyrazolidone, 1-phenyl-4-methyl-3-pyrazolidone, 1-phenyl-4,4-dimethyl-3-pyrazolidone, 1-p-chlorophenyl-3-pyrazolidone, and the like; aminophenol compounds such as N-methyl-p-aminophenol, p-aminophenol, 2,4-diaminophenol, p-benzylaminophenol, 2-methyl-p-aminophenol, 2-hydroxymethyl-p-aminophenol, and the like; polyhydroxy benzene compounds such as hydroquinone, catechol, chlorohydroquinone, pyrogallol, bromohydroquinone, isopropylhydroquinone, toluhydroquinone, methylhydroquinone, 2,3-dichlorohydroquinone, 2,5-dimethylhydroquinone, 2,3-dibromohydroquinone, resorcin, and the like; gallic acid, ascorbic acid, tannic acid, and the like; etc.

The development accelerator (2) is an alkaline material necessary to activate the developing agent. Useful alkaline materials are inorganic alkalis such as sodium metaborate, sodium hydroxide, sodium carbonate, sodium bicarbonate, lithium hydroxide, lithium phosphate, potassium metaborate, potassium hydroxide, potassium carbonate, potassium bicarbonate, sodium phosphate, lithium carbonate, lithiumm bicarbonate, lithium metaborate, and the like, ammonia, or the like. It is preferred that the pH of the developer is maintained at from about 9 to 13, particularly preferably from 10 to 12.

As an inhibitor (3), potassium bromide is generally added to the developer to thereby control the dissociation of silver halide and decrease the silver ion concentration, and thus development is controlled, thereby preventing the formation of fog.

Potassium bromide, sodium bromide, ammonium bromide, the compounds described in U.S. Pat. Nos. 3,161,513, 3,161,514, British Pat. Nos. 972,211, 1,030,442, 1,144,481, 1,251,558, etc. can be used as an anti-fogging agent (4) with potassium bromide being generally added to the developer. In the case of a strong developer, benzimidazole derivatives and the like are used. For example, nitroimidazoles, such as nitrobenzimidazole, oxazoles, thiazoles, triazoles, tetrazoles such as 1-phenyl-5-mercaptotetrazole, thioanilides, thioglycols, and the like can be used.

Antioxidants react with oxygen in air, losing their development activity and causing a reduction in the development rate, and thus the effect of the developer is markedly deteriorated. Therefore, preservatives (5), e.g., sulfites such as sodium sulfite, sodium bisulfite, and the like, metasodium bisulfite, and the like can be used.

The silver halide exposed in the second exposure is developed and at the same time, the emulsion layer is hardened in the developed silver areas. This condition is illustrated in D. The thus obtained material is dipped in hot water at about 50° C. and the unhardened areas, that is, the emulsion layer at the negative image areas formed in the first exposure is removed together with the silver present in the emulsion layer, and thus a positive relief image is obtained. After drying the light-sensitive plate having the relief as obtained above, the light-sensitive plate is heated, if necessary, along with the hardening treatment, thereby strengthening the oleophilic property of the hardened emulsion layer, and thus a printing plate can be obtained.

Hitherto, in the case of reversing a photographic image in the photographic field, a process has been employed which comprises developing an exposed film, removing the negative silver image as obtained by the above development by bleaching and dissolving with a sulfuric acid-potassium bichromate solution, neutralizing the remaining acid, applying a uniform strong exposure to the silver halide remaining after the neutralization, and then applying a second development to thereby reduce the silver halide remaining in the (photosensitive) emulsion layer to silver (image), whereby a reversal image is obtained. However, in accordance with the present invention, the bleaching of the negative silver image formed by the first development can be omitted.

Figure 2:
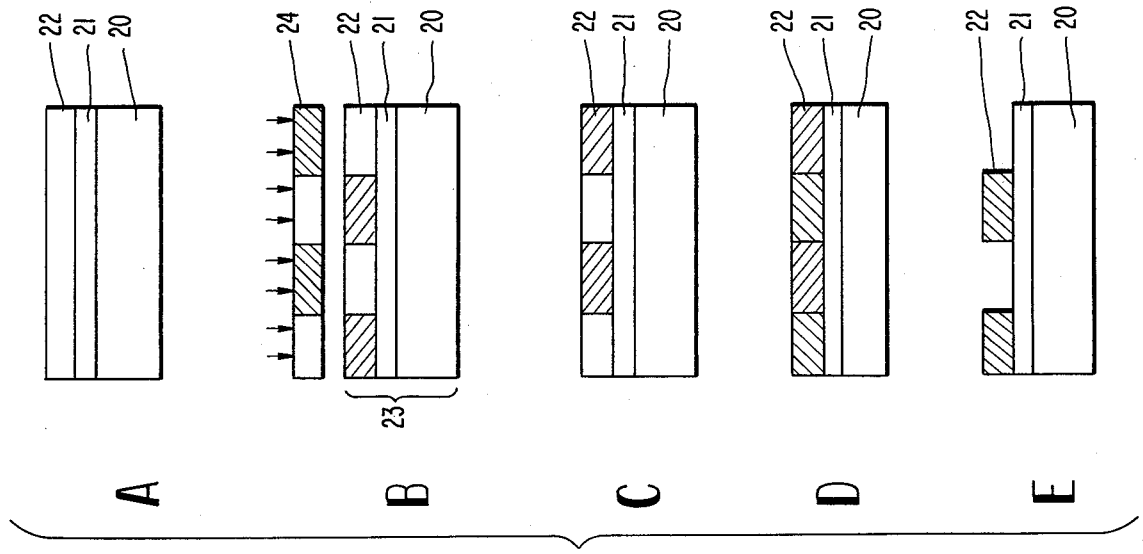
FIGS. 1 and 2 illustrate embodiments of the present invention for producing a printing plate by showing a sectional view of the printing plate at various stages in the process.

FIG. 2 is illustrative of a second embodiment of the present invention, in which A designates a sectional view of a light-sensitive printing plate material and 20 designates a support having a hydrophilic surface 21 and 22 designates a direct positive type of unhardened silver halide emulsion layer. B throught E designate sectional views of the printing plate material at the main steps in the course of producing a printing plate in accordance with this embodiment of the present invention. B illustrates the condition in which exposure is applied through a negative original 34 having a half-tone image or line drawing. In this case, at the areas of the emulsion layer 22 of the light-sensitive printing plate material corresponding to the non-image areas of the original, a latent image is formed. C illustrates the condition in which the printing plate material is developed with a common developer, and a silver image is formed at the non-exposed areas of the emulsion layer 22. The silver image is a negative image identical to the original. In D, the printing plate material is dipped in glacial acetic acid after development, is exposed to a uniform fogging exposure (the second exposure) after a slight washing, and then is subjected to tanning development. The silver halide exposed in the second exposure is developed and at the same time, at the developed silver areas, the emulsion layer is hardened. In E, the unhardened areas, that is, the emulsion layer at the negative image formed in the first development is removed together with the silver present therein by dipping in hot water at about 50° C., and thus a positive oleophilic relief image is obtained. The thus obtained relief image is subjected to the same treatment as used in embodiment 1 to thereby produce a printing plate. Thus, in accordance with the method of the present invention, a positive duplicate can be produced from a positive original using a common negative type silver halide emulsion, while a positive duplicate can be produced from a negative original using a direct positive type emulsion. Thus, as compared with conventional methods in which a lith type light-sensitive material and a lith type processing are used, the method of the present invention is economically advantageous in that a light-sensitive material for an intermediate negative is not required and the step of producing the intermediate negative is not required, and the method has a feature in that much labor can be saved.

The light-sensitive material which can be used in the present invention, can be produced by, for example, providing an anodic oxidation film on the surface of a dimensionally stable support such as an aluminum plate, coating on the film as prepared above an unhardened silver halide emulsion containing no hardening agent subjected to panchromatic sensitization, and furthermore, coating a thin protective layer of a hydrophilic colloid such as gelatin on the emulsion layer as prepared above. Additional examples of metal supports include iron, copper, zinc, or brass, etc. supports having a thin layer of chromium, nickel, chromium-nickel alloy, chromium-iron alloy, nickel-iron alloy, chromium-nickel-iron alloy, etc., thereon (e.g., a layer thickness of about 0.1 μm to 10 μm, preferably 0.2 μm to 5 μm). Suitable coating techniques such as vacuum deposition, sputtering, etc. which are well known in the art can be used to produce such a thin layer.

The support need not necessarily be opaque. If the support is transparent, the second exposure can be applied through the support. As opaque supports, a metal support can be used, and mainly an aluminum plate is used. The aluminum plate preferably has a purity of 99.5% or more in order to provide a silver-white oxidation film. Where a colored oxidation film is produced which can be used as an anti-halation layer, known aluminum alloys can be used. The support can be in the form of a sheet, a film-like sheet, and those supports in which an aluminum sheet is laminated on a plastic film. The anodic oxidation film can be formed by electrolizing the surface thereof using a suitable concentration chromic acid or sulfuric acid aqueous solution, or aqueous solutions of organic acids such as oxalic acid, and malonic acid, or organic sulfonic acids such as sulfosalicylic acid as an electrolyte. Examples of the electrolytes and electrolysis conditions are as follows:

|  | Sample 1 | Sample 2 |
| --- | --- | --- |
| Electrolyte | 12 wt % $H_2SO_4$ | 4 wt % $(COOH)_2$ |
| Temperature of Electrolyte | 20° C | 15° C |
| Current Density | DC 1 A/dm$^2$ | DC 15 A/dm$^2$ |
| Electrolysis Voltage | 15 V | 45 V |
| Electrolysis Time | 30 minutes | 45 minutes |

The formation of an anodically oxidized film is described in detail in U.S. Pat. Nos. 1,965,683, 1,933,301 and 2,014,169, etc.

The use of a light-sensitive material produced by providing an emulsion layer on an anodic oxidation film, is advantageous in that the reduction of image quality, accuracy, and the like due to tanning development does not occur at all and an image of extremely high quality can be formed on the anodic oxidation film.

As a transparent support, those supports generally used in this field, for example, those supports produced by providing a hydrophilic layer on the surface of a resin film such as polyethylene terephthalate, cellulose acetate, or the like, a synthetic paper, a water-proof paper, a ceramic plate, or the like, can be used. Since a film produced by proving a hydrophilic layer on the surface of polyethylene terephthalate film has excellent dimension stability, flexibility, and the like, such a film is often used. The hydrophilic layer provided on the support must adhere strongly to the surface of the support and to the emulsion layer subjected to tanning development in the course of production of the printing plate. Representative examples of hydrophilic layers satisfying the above requirements are those produced by dissolving or dispersing gelatin, gum arabic, alginic acid, hydroxyethyl cellulose, methyl cellulose, carboxymethyl cellulose, polyacrylamide, polyvinyl pyrolidone, copolymers thereof, polyvinyl alcohol, polyvinyl alcohol derivatives, a maleic anhydride-vinyl acetate copolymer, a maleic anhydride-ethylene copolymer, a maleic anhydride-methyl vinyl ether copolymer, a maleic anhydride-styrene copolymer, the half ester derivatives or the half amide derivatives thereof, acrylic acid copolymers, methacrylic acid copolymers, partially saponified cellulose acetate, partially saponified cellulose acetate butyrate, or cellulose nitrate in an organic solvent, and coating the resulting solution on a support using general methods and drying.

Organic solvents, which can be used in the present invention, are those solvents capable of dissolving or swelling the support surface. For example, acetone, methyl ethyl ketone, cyclohexanone, tetrahydrofuran, dioxane, methanol, ethanol, ethyl formate, methyl acetate, ethyl acetate, benzene, toluene, methylene chloride, ethylene chloride, tetrachloroethane, trichloroethane, chloroform, chlorobenzene, ethylchlorohydrin, chlorosulfonic acid, nitromethane, dimethylformamide, morpholine, formic acid, acetic acid, benzoic acid, salicylic acid, salicylic acid esters, monochloroacetic acid, dichloroacetic acid, trichloroacetic acid, trifluoroacetic acid, 2-nitropropanol, benzyl alcohol, benzaldehyde, acetonylacetone, acetophenone, benzamide, benzonitrile, benzylamine, methyl nicotinate, phenol, o-chlorophenol, cresol, and other phenol derivatives can be used. They can be used individually or in admixtures comprising two or more thereof. A suitable organic solvent can be appropriately chosen depending upon the property of the support used.

An effective hydrophilic layer can be obtained by appropriately controlling the composition or thickness thereof depending upon the property of the support on which the hydrophilic layer is provided, the composition, degree of hardening, and thickness of the emulsion layer provided on the hydrophilic layer, and the quantity of silver as formed by development. A thickness beyond the necessary level is disadvantageous in processing properties, printing properties, and the like. Thus, a preferred thickness is generally from about 0.1 to 2μ, and particularly from about 0.2 to 1.0μ.

The hydrophilic layer can contain other materials provided that the layer satisfies the above requirements. For example, an agent for enhancing the hydrophilic property, e.g., colloid silica, or a dye or pigment to render the surface of the printing plate easy to see, can be added.

Silver halide emulsions which can be used in the present invention are those containing silver halides such as silver chloride, silver iodide, silver chlorobromide, silver iodobromide, silver chloroiodobromide, silver chloroiodide, and the like. A suitable silver coating amount on the support generally ranges from about 50 to 1000 μg/cm$^2$, preferably 100 to 700 μg/cm$^2$. The emulsion layer is characterized in that the half-tone dot is faithfully reproduced by the first development and it is formed into a hard dot. Needless to say, the unhardened areas of the emulsion layer formed by the first development must be easily removable by washing-off after the tanning development. Thus, a medium forming the emulsion layer must be easily removable by washing-off. Those compounds generally used in this field as such a medium, for example, gelatin, polyvinyl alcohol, polyacrylamide, and other numerous polymers, which are hardenable by the tanning development, can be used. In addition, those polymers which are not hardenable themselves, can be used in combination with hardenable polymers. For example, a light-sensitive resin or thermosetting resin can be added to the emulsion layer, and after relief formation, re-hardening is effected by applying light or heat.

The light-sensitive material as used in the present invention can be provided with, if desired, an anti-halation layer, a protective layer, and other auxiliary layers.

The image exposure in the present invention is conducted with a positive or negative as an original. As the original, a line drawing original, a halftone dot original, or a color transparency or a color negative having a continuous gradation, and the like can be used. A duplicate can be produced from a reflection original. That is, since silver halide is used as the light-sensitive material, contact printing, reflection printing, enlargement, and direct camera photography (applying screening directly are possible.

In the first developing treatment in the present invention, generally used black and white developers are employed which contain developing agents such as p-methylaminophenol, 1-phenyl-3-pyrazolidone, hydroquinone, diaminophenol, and the like, individually or in mixture with each other. In some cases, an alkali activated developing treatment can be applied. This first developer should not harden the silver halide emulsion layer. The silver image formed by the first developer determines the gradation of the duplicate, and thus, in the case of half-tone work from an original by means of a direct screening technique, the treatment is particularly important, and the use of a lith type developer accompanied by infectuous development is advantageous.

The first development is stopped, e.g., by dipping the light-sensitive plate member into an aqueous solution of an acid which does not stain light-sensitive materials nor dissolve silver, for example, by dipping the light-sensitive plate member in a 0.5 to 3% by weight, preferably 1 to 2% by weight, glacial acetic acid solution for about 10 seconds to 3 minutes, preferably 15 to 60 seconds. After a slight washing, reverse exposure is applied. The reverse exposure is applied uniformly from the side of surface of the light-sensitive material or the support, so that the silver halide at the areas not developed by the first development is exposed. This exposure need necessarily be applied in the case of using the second developer containing a chemical fogging agent.

Suitable chemical fogging agents which can be used include hydrazine derivatives (e.g., hydrazine, hydrazinoacetic acid, hydrazinobenzoic acid, phenylhydrazine, tolylhydrazine, etc.), boron hydrides (diborane, tetraborane, etc.), borane carbonate, amineboranes (e.g., ammonium borane, trimethylamine borane, dimethyldodecylamine borane, t-butylamine borane, pyridine borane, picoline borane, morpholine borane, 2,6-lutidine borane, benzylamine borane, etc.), complexes of tin (II) sulfate or acetate with lactic or tartaric acid, thioureadioxide (i.e., formamidinesulfinic acid (I)), etc.

A suitable wave length range for both the image-wise exposure and the reverse exposure is about 400 to 500 nm for a regular emulsion, about 400 to 600 nm for an orthochromatically sensitized emulsion and about 400 to 730 nm for a panchromatically sensitized emulsion for about $10^{-4}$ sec. to 10 min., more generally $10^{-2}$ sec. to 2 min., using a tungsten incandescent lamp, a xenon lamp, a fluorescent lamp (of any type), a mercury vapor lamp (a low pressure, high pressure and ultra-high pressure, etc. type), sunlight, etc. as a light source. The wave length ranges and exposure times set forth above are merely exemplary and such can be varied depending on the light-sensitive material used and the end-use purposes, etc.

In the second developing treatment, a tanning developer for hardening a hydrophilic resin layer or a silver halide emulsion layer is used to thereby develop the silver halide particles not developed by the first development and, at the same time, harden the emulsion layer at these areas. Thus, as the second developer, generally used developers, for example, those developers containing developing agents such as pyrogallol, catechol, and the like, can be employed. A developer containing hydroquinone, in combination with a small amount of sodium sulfite, exhibits a good tanning action.

After the second development, the oxidized developing agent is removed by treating with an acid solution of a fixing agent. Representative fixing agents are thiosulfates (sodium thiosulfate, potassium thiosulfate, ammonium thiosulfate, etc.), thiocyanates (sodium thiocyanate, potassium thiocyanate, ammonium thiocyanate, etc.), organic diol compounds (3-thia-1,5-pentanediol, 3,6-dithia-1,8-octanediol, 3,6,9-trithia-1,11-undecanediol, 3,6,9,12-tetrathia-1,14-tetradecanediol, etc.), water-soluble sulfur-containing organic dibasic acids and their water-soluble salts (ethylenebisthioglycolic acid, and the sodium salt and potassium salt thereof, etc.), etc. A suitable acid fixing solution can have the following composition

| | |
|---|---|
| Sodium Thiosulfate | 200 g |
| Sodium Sulfite (anhydrous) | 10 g |
| Sodium Hydrogensulfite (anhydrous) | 25 g |
| Water to make | 1 liter |

Then, "relief formation" is effected, e.g., with hot water at about 50° C. That is, a relief image is formed by washing the unhardened emulsion with hot water. Thereafter, the relief image is dipped in water at about 20° C. or an emulsion hardening solution, and dried. At this time, if desired, a heat treatment is applied to thereby produce a printing plate.

The printing plate produced in accordance with the present invention can be used in printing by conventional methods.

The present invention will be described in greater detail by reference to the following examples. Unless otherwise indicated, all parts, percents ratios and the like are by weight.

EXAMPLE 1

On an anodic oxidation film of a 0.2 mm thick aluminum plate produced by treating the aluminum plate by the sulfuric acid method, a lith type panchromatically sensitized silver chlorobromide emulsion containing no hardening agent (70% silver chloride, containing 1 mole of silver per Kg of the emulsion) was coated in a thickness of 3μ to thereby produce a light-sensitive printing plate material.

The light-sensitive printing plate material was provided with a contact screen and was exposed through a color positive original provided with a mask having a continuous gradation. Exposure was conducted at a distance of 1 meter for 2 seconds at 18 volts, in which a Fuji Exposure Lamp was used as a light source and a red filter, Wratten No. 29, was used. Development was conducted using a lith developer (Super Lisodor produced by Fuji Photographic Film Co., Ltd.) at 20° C. for 3 minutes to thereby produce a negative silver image.

The plate was dipped in a 1.5% aqueous solution of glacial acetic acid for 15 seconds to thereby stop the development, and after washing for 30 seconds and draining, the second development was effected. Uniform exposure was applied from the surface of the emulsion using a 300 watt photographic lamp at a distance of 1 meter for 15 seconds.

The plate was developed with a tanning developer having the following composition at 20° C. for 2 minutes to thereby produce a positive silver image thereon, and at the same time, to harden the gelatin in the emulsion layer.

Developer Composition

| A Liquid | |
|---|---|
| Pyrogallol | 6 g |
| p-Methylaminophenol | 3 g |
| Citric Acid | 5 g |
| Water to make | 1 liter |

| B Liquid | |
|---|---|
| Sodium Carbonate | 200 g |
| Potassium Bromide | 5 g |
| Calgon | 3 g |
| Water to make | 1 liter |

1 part of A Liquid and 1 part of B Liquid were mixed, prior to use.

The plate was dipped in a treating solution having the following composition for 30 seconds.

| Sodium Sulfite (anhydrous) | 10 g |
|---|---|
| Sodium Hydrogensulfite (anhydrous) | 25 g |
| Water to make | 1 liter |

The light-sensitive material was dipped in hot water at 50° C. to thereby remove the unhardened gelatin. In this way, the silver and gelatin at the negative image areas formed in the first development were removed and a relief image of positive half-tone remained. The plate was dipped in water at 20° C. for 30 seconds and then in an alkaline formaldehyde solution for 1 minute, and thereafter, it was dried by heating. Thus, a cyan printer (color separation positive printing plate) or an original was formed.

The cyan printer was mounted on Davidrin 500 type off-set printer (produced by Davidson Co., Ltd.), and 30,000 sheets were printed using a commercially available ink and fountain solution. A cyan printer image of an original was obtained as a print of high quality which was excellent in the reproduction of continuous gradation. The surface of the printing plate was free from any scratches, and further printing was possible.

In the same manner, a four-colored print was produced by multi-printing a magenta image, a yellow image, and black image.

EXAMPLE 2

A cellulose triacetate film having a thickness of 150μ was dipped in the following sodium hydroxide solution at 30° C. for 10 seconds and was slightly washed and dried. Thus, a sheet material having a hydrophilic surface was obtained.

| Sodium Hydroxide | 2.5 Kg |
|---|---|
| Methyl Alcohol | 8 Kg |
| Water to make | 15 Kg |

On the thus prepared sheet material, a silver chloride emulsion (70% silver chloride) containing 1 mole of silver per Kg of the emulsion was coated in a thickness of 4μ to thereby produce a light-sensitive material. The light-sensitive material was exposed through a positive original of a line drawing, and it was treated in the same manner as in Example 1. Thus, results similar to these in Example 1 were obtained.

EXAMPLE 3

A support was produced by coating cellulose triacetate on the surface of a 180μ thick polyethylene terephthalate film in a thickness of 3μ. The resulting support was treated in the same manner as in Example 1. Thus, results similar to those in Example 2 were obtained.

EXAMPLE 4

In Example 1, a light-sensitive plate was produced using an auto-positive emulsion and exposed through a negative original. Thereafter, the same developer as described in Example 2 was used. The other procedures were the same as in Example 1, and thus 10,000 sheets of good prints were obtained.

EXAMPLE 5

The procedure of Example 1 was repeated except that 4-phenylcatechol was used as a tanning developing agent. 20,000, sheets of good prints were obtained as in Example 1.

While the invention has been described in detail and with reference to specific embodiments thereof, it will be apparent to one skilled in the art that various changes and modifications can be made therein without departing from the spirit and scope thereof.

What is claimed is:

1. A sequential process for producing a printing plate which comprises imagewise exposing a light-sensitive material comprising a support with a hydrophilic surface and having thereon an unhardened silver halide emulsion layer on said support, then developing said light-sensitive material with a non-tanning developer, then fogging the remaining silver halide which did not receive said imagewise exposure by exposing said remaining silver halide to radiation, then developing said remaining silver halide with a tanning developer and, at the same time, hardening said emulsion layer at said remaining silver halide areas, and then removing the unhardened emulsion layer with hot water, whereby an oleophilic hardened relief image is formed.

2. The process according to claim 1, wherein the tanning developer comprises a developing agent, a development accelerator, an inhibitor, and an anti-fogging agent.

3. The process according to claim 1, wherein the nontanning developer comprises a developing agent, a development accelerator, an inhibitor, an anti-fogging agent, and a preservative.

4. The process according to claim 3, wherein the developing agent is a combination of 3-pyrazolidone and a polyhydroxybenzene or a combination of an aminophenol and a polyhydroxybenzene.

5. The process according to claim 1, wherein the support with a hydrophilic surface is an anodically oxidized aluminum plate.

6. The process according to claim 1, wherein said unhardened silver halide emulsion comprises at least one compound, which is hardenable by tanning development, selected from the group consisting of gelatin, polyvinyl alcohol and polyacrylamide.

7. The process according to claim 1, wherein after removing the unhardened emulsion layer, the light-sensitive material is headed to strengthen the oleophilic property of the hardened relief image.

* * * * *